United States Patent
Lee et al.

(10) Patent No.: US 9,679,855 B1
(45) Date of Patent: Jun. 13, 2017

(54) POLYMER CRACK STOP SEAL RING STRUCTURE IN WAFER LEVEL PACKAGE

(71) Applicant: QUALCOMM Incorporated, San Diego, CA (US)

(72) Inventors: Jae Sik Lee, San Diego, CA (US); Hong Bok We, San Diego, CA (US); Dong Wook Kim, San Diego, CA (US); Jon Aday, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/082,954

(22) Filed: Mar. 28, 2016

(51) Int. Cl.
*H01L 23/544* (2006.01)
*H01L 21/301* (2006.01)
*H01L 21/46* (2006.01)
*H01L 21/78* (2006.01)
*H01L 23/00* (2006.01)

(52) U.S. Cl.
CPC .......... *H01L 23/562* (2013.01); *H01L 23/544* (2013.01); *H01L 23/564* (2013.01); *H01L 2223/5446* (2013.01)

(58) Field of Classification Search
CPC .... H01L 23/562; H01L 23/544; H01L 23/564
USPC ............ 257/620; 438/461, 644, 464; 25/620
See application file for complete search history.

(56) References Cited

U.S. PATENT DOCUMENTS

| | | | | |
|---|---|---|---|---|
| 4,784,720 A | * | 11/1988 | Douglas | H01L 21/3065 204/192.23 |
| 5,465,860 A | * | 11/1995 | Fujimoto | G02B 6/1221 216/24 |
| 6,975,017 B2 | | 12/2005 | Towle et al. | |
| 7,572,738 B2 | | 8/2009 | Nogami | |
| 8,048,761 B2 | | 11/2011 | Yeo et al. | |
| 8,610,238 B2 | | 12/2013 | Kaltalioglu et al. | |
| 2007/0102791 A1 | | 5/2007 | Wu | |
| 2009/0203192 A1 | * | 8/2009 | Kaltalioglu | H01L 21/31116 438/462 |
| 2013/0062727 A1 | * | 3/2013 | Huang | H01L 23/3178 257/506 |

* cited by examiner

*Primary Examiner* — David S Blum
(74) *Attorney, Agent, or Firm* — Loza & Loza, LLP

(57) ABSTRACT

Some implementations provide a semiconductor device (e.g., die, wafer) that includes a substrate, that is configured with trenches that are dry-etched into a surface of the substrate inside an area defined by scribe lines of the substrate. A crack stop structure is provided for the semiconductor device that includes a polymer dielectric layer coating that fills the trenches with a polymer dielectric material and provides a dielectric layer over the surface of the substrate inside the area. The polymer dielectric layer coating and trenches are configured to reduce cracking or chipping of the substrate in the area defined by scribe lines after cutting.

21 Claims, 7 Drawing Sheets

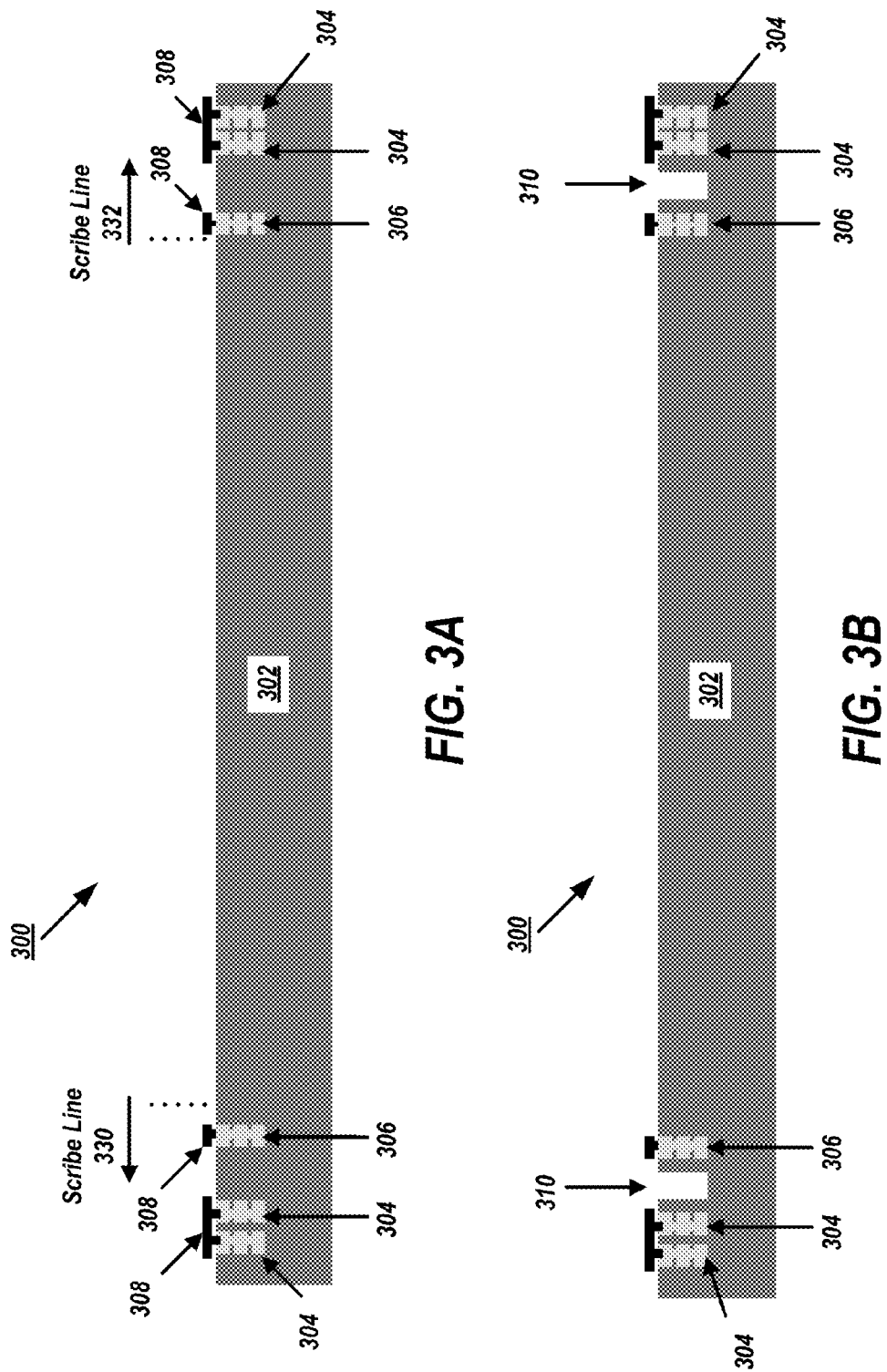

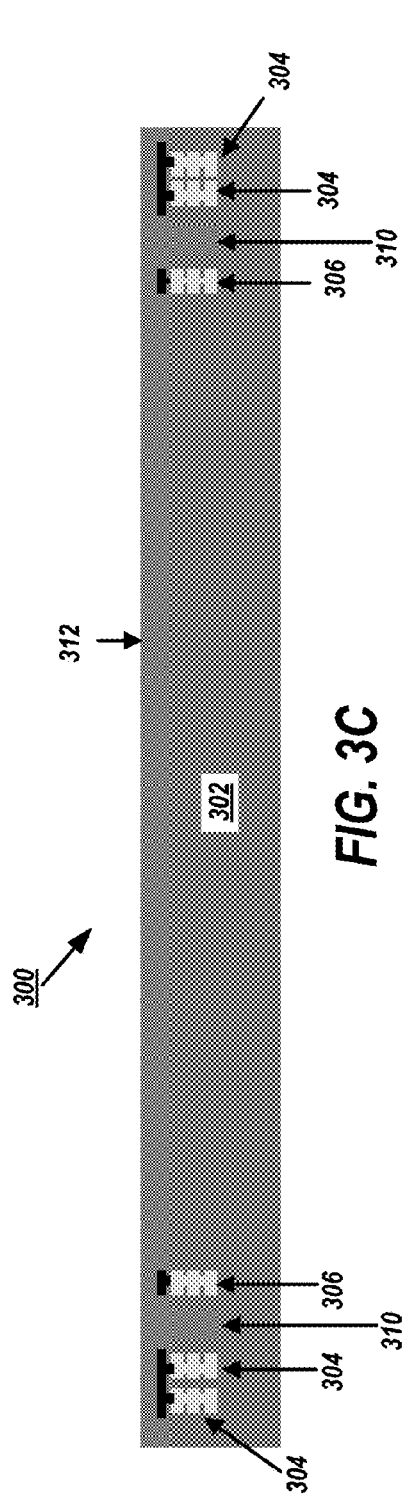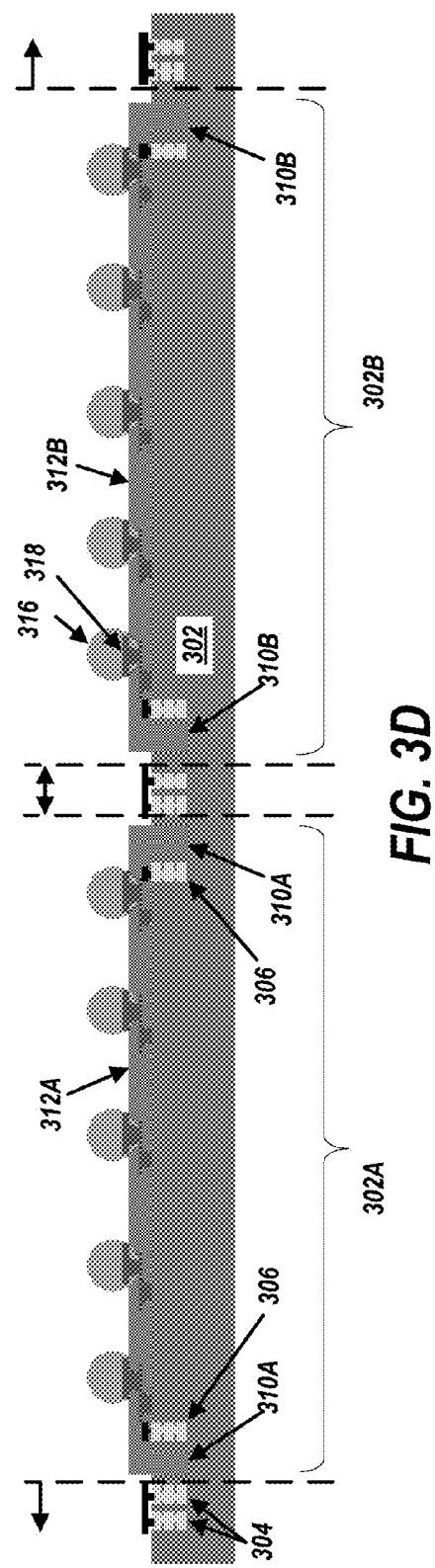

POLYMER CRACK STOP SEAL RING STRUCTURE IN WAFER LEVEL PACKAGE

BACKGROUND

Field

Various features relate to a crack stopping configuration for integrated circuits, and, more specifically to a crack stopping structure in wafer level packaging (WLP).

Background

Wafer-level packaging (WLP) is a technology directed to packaging an integrated circuit while still part of the wafer, in contrast to the more conventional method of slicing the wafer into individual circuits (dice) and then packaging them. WLP may be considered a true chip-scale package (CSP) technology, since the resulting package may be practically of the same size as the die. Wafer-level packaging allows integration of wafer fab, packaging, test, and burn-in at wafer level in order to streamline the manufacturing process undergone by a device from silicon start to customer shipment.

A typical die is manufactured by depositing several metal layers and several dielectric layers on top of a substrate. The die is manufactured by using a WLP process. The substrate, metal layers and dielectric layers are what form the circuit elements of the die. Multiple dies are usually manufactured on a wafer. FIG. 1 illustrates a plan view of a wafer 100 that includes several uncut dies 102. Each uncut die includes a substrate, metal layers and dielectric layers. The wafer 100 is then cut into individual/single dies. FIG. 1 also illustrates vertical and horizontal scribe lines 104-106. Scribe lines are portions of the wafer 100 that are cut in order to manufacture the individual dies (e.g., die 102).

FIG. 2 illustrates a side view of a wafer. Specifically. FIG. 2 illustrates a side view of a portion of a wafer 200. The wafer 200 may include several metal and dielectric layers 202, a pad 204, a passivation layer 206, a first insulation layer 208, a first metal layer 210, a second insulation layer 212, and an under bump metallization (UBM) layer 214. FIG. 2 also illustrates a solder ball 216 on the wafer 200. Specifically, the solder ball 216 is coupled to the UBM layer 214. The pad 204, the first metal layer 210 and the UBM layer 214 are a conductive material (e.g., copper). The first insulation layer 208 and the second insulation layer 212 are polyimide layers (PI), polybenzoxazole (PBO) or other polymer layers used for repassivation. FIG. 2 also illustrates a region of the wafer 200 that will be cut to create individual dies. This region of the wafer 200 is illustrated by the scribe line 218, which may correspond to either of the scribe lines 104-106 of FIG. 1.

During a WLP manufacturing process, dies may be separated either by a scribe-and-break method, mechanical sawing, laser dicing, or a combination of these techniques. During laser grooving and/or mechanical sawing, heat affect zones (HAZ) and/or micro cracks may appear, often resulting in device failure. This becomes more severe in extreme low-k (ELK) devices (e.g., configurations of 28 nm and above). In addition, passivation layer delamination after reliability may occur, resulting in device failure.

Accordingly, there is a need for techniques and technologies for preventing or reducing the propagation of cracking and/or chipping of a die.

SUMMARY

Various features relate to a reinforced wafer level package that includes a core layer for reducing stress in a solder joint and improving solder joint reliability.

A first example provides a semiconductor device, that includes a substrate, wherein the substrate comprises trenches that are etched into a surface of the substrate inside an area defined by scribe lines of the substrate. A crack stop structure is also provided that includes a polymer dielectric layer coating that fills the trenches with a polymer dielectric material and provides a dielectric layer over the surface of the substrate inside the area, wherein the polymer dielectric layer coating is configured to reduce cracking or chipping of the substrate in the area defined by scribe lines after cutting.

A second example provides a method for fabricating a semiconductor device, comprising providing a substrate, and forming trenches in the substrate by etching a surface of the substrate inside an area defined by scribe lines of the substrate. The method also includes forming a crack stop structure using a polymer dielectric layer coating by filling the trenches with a polymer dielectric material and providing a dielectric layer over the surface of the substrate inside the area for reducing cracking or chipping of the substrate in the area defined by scribe lines after cutting.

A third example provides a semiconductor device that includes a die substrate, wherein the die substrate comprises a periphery formed by cutting. The die substrate also includes trenches that are etched into a surface of the substrate inside an area of the periphery prior to the cutting. The semiconductor device also includes a crack stop structure that includes a polymer dielectric layer coating that fills the trenches with a polymer dielectric material and provides a dielectric layer over the surface of the die substrate inside the area of the periphery prior to the cutting, wherein the polymer dielectric layer coating is configured to reduce cracking or chipping of the substrate at an edge inside of the periphery.

DRAWINGS

Various features, nature and advantages may become apparent from the detailed description set forth below when taken in conjunction with the drawings in which like reference characters identify correspondingly throughout.

FIG. 3A illustrates a side view of a die portion of a wafer prior to etching along scribe lines under an embodiment;

FIG. 3B illustrates a side view of the die of FIG. 3A after etching along scribe lines under an embodiment FIG. 3C illustrates a side view of the die of FIG. 3B and further including a dielectric layer coating of a surface of the die, including trenches created by etching under an embodiment;

FIG. 3D illustrates a wafer-level side view of additional die components added to the die of FIG. 3C in the dielectric layer coating under an embodiment;

Figure 5:
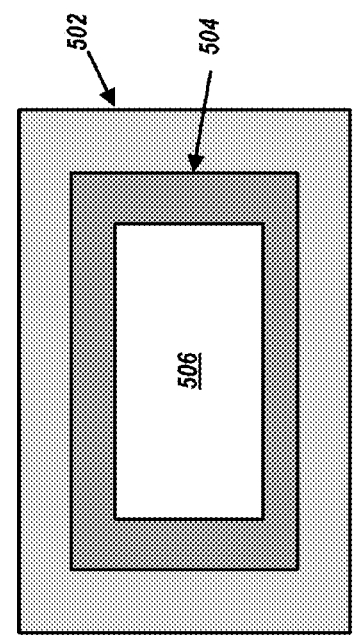
Figure 6:
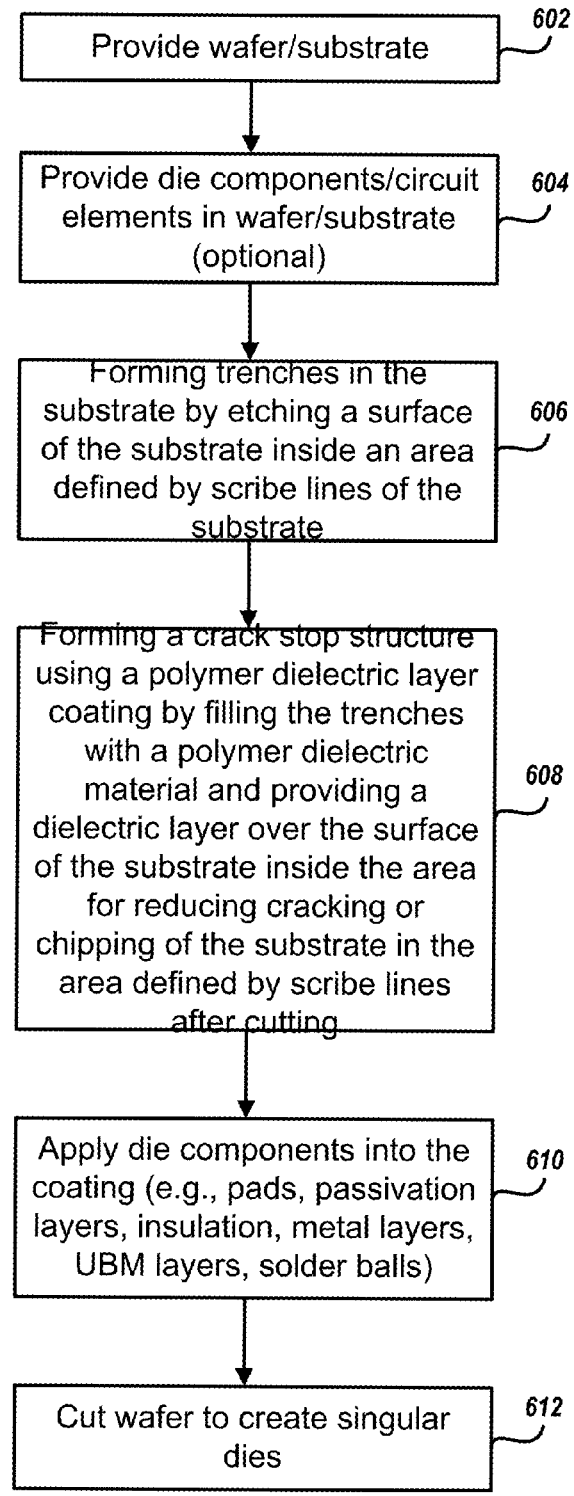
Figure 7:
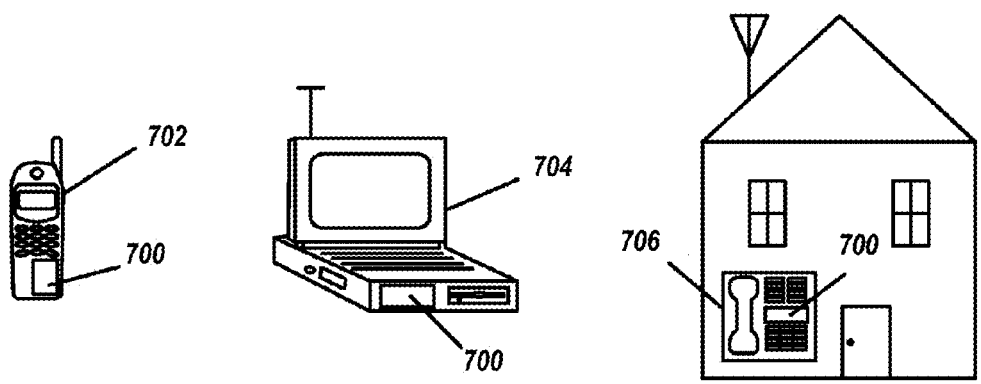

FIG. 5 shows a top view of a die having a polymer seal ring and WLP layer under an illustrative embodiment FIG. 6 shows a method for forming a crack stop structure for a die under an illustrative embodiment; and FIG. 7 illustrates various electronic devices that may integrate an integrated device, an integrated device package, a semiconductor device, a die, an integrated circuit, a substrate, an interposer, a package-on-package device, and/or PCB described herein.

DETAILED DESCRIPTION

The figures and descriptions provided herein may have been simplified to illustrate aspects that are relevant for a clear understanding of the herein described devices, structures, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Overview

Some features pertain to a package that includes a wafer having dies that include trenches etched next to scribe lines for each die of the wafer. The wafer may then be subjected to a coating of a dielectric layer which fills the trenches and may create a bottom dielectric coating layer on the surface of the wafer. The trench filled with the dielectric layer provides support to the edges of each die of the wafer and serves as a crack stop configuration or structure. In some implementations, the bottom dielectric coating may be used as part of several dielectric and metal layers for a die as disclosed above, and may be processed to include other die components, such as pad(s), passivation layer(s), insulation layers, an under bump metallization (UBM) layer and solder balls, among others.

In some implementation, the die with the crack stop structure is an element or component of a device (e.g., integrated device, integrated device package, die) and/or a base (e.g., package substrate, printed circuit board, interposer) that allows or facilitates an electrical connection between two points, elements and/or components. In some implementations, the die with the crack stop structure may include a trace, a via, a pad, a pillar, a redistribution metal layer, and/or an UBM layer. In some implementations, the die with the crack stop structure may include an interconnect having an electrically conductive material that provides an electrical path for a signal (e.g., data signal, ground signal, power signal). An interconnect may be configured to include more than one element/component.

Exemplary Die with a Crack Stop Structure

FIG. 3A shows a die portion 300 of a wafer (e.g., wafer 100), prior to etching along scribe lines under an illustrative embodiment. Die portion 300 includes a substrate 302 that may be configured with one or more back end of line (BEOL) structures including, but not limited to, seal rings 306 (or "dummy bars") and test structures 304. Each of the seal rings 306 and test structures 304 may be coupled to a metal contact (e.g., aluminum) 308, as needed.

Figure 1:
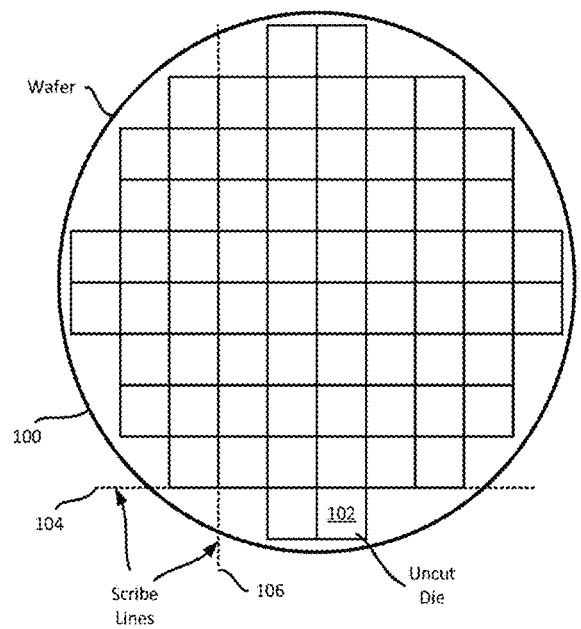
FIG. 1 illustrates a wafer that includes uncut dies under one example.
Figure 2:
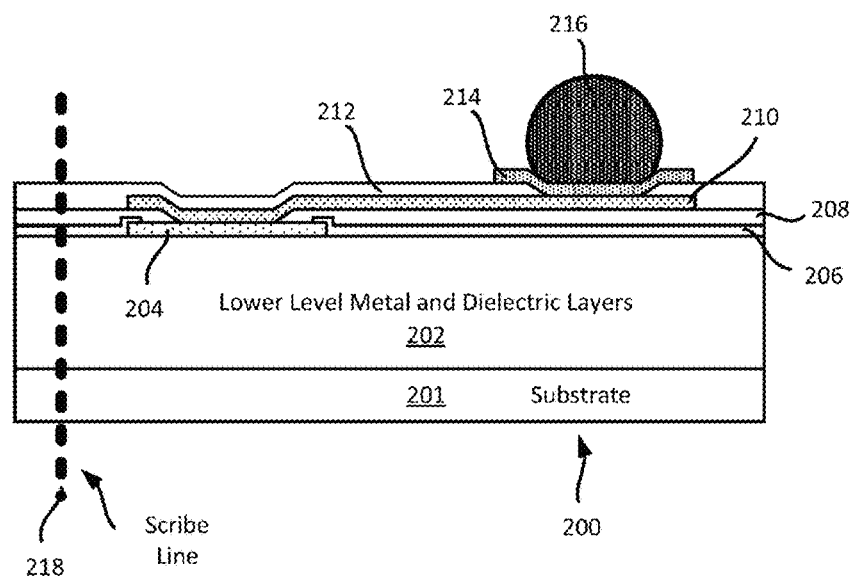
FIG. 2 illustrates a side view of a die under one example.

Test structures 304 may include process control monitor (PCM) test structures and/or test element group (TEG) structures that are known in the art. PCM typically involves the design and fabrication of special structures to monitor various interconnect parameters such as sheet resistance, contact resistance, delta line width, etc. PCM structures are placed across a semiconductor wafer at specific locations to gain a better understanding of the process variation, and may be placed in the area of scribe line 330, 332, also known as a dicing line, kerf, street, or test key, separating adjacent dies on the wafer as illustrated above in connection with FIG. 1.

Similarly, a predetermined pattern of measuring elements or test elements (TEGs) may be formed as test structures 304 on a scribe line area 330, 332 of a semiconductor wafer to assess electric properties of elements constituting an integrated circuit chip, The TEG may be used for electrically testing and determining whether elements are suitably formed in integrated circuit chips formed on the wafer.

The seal rings 306 may be formed of interconnected metal lines and connecting vias as shown in the figure, and may be formed on an inner side of a scribe line 330, 332. Seal rings may include interconnected metal components, which are formed of metal lines and conductive vias, both formed in dielectric layers. The metal lines and vias may be physically connected and a passivation film may be formed over a top layer of the seal rings 306.

During operation, seal rings 306 function to protect the circuit region on the inner side of seal rings 306 from influences of external environments, which may cause cracking in the substrate. Seal rings 306 may be electrically grounded. To have greater strength, vias of each respective seal ring 306 may be interconnected, forming a continuous via bar. A further function of seal rings 306 is to protect the integrated circuits on the inner side of seal ring 10 from moisture-induced degradation. Since seal rings 306 may be formed of metal, it blocks the moisture penetration path and may substantially eliminate any moisture penetration.

Although continuous via bars, combined with metal lines, can protect cracking from extending into circuit regions, seal rings 306 do not provide optimal protection for a die. If the seal ring is damaged, there will be no structure for preventing cracks from propagating into the substrate. Also, seal rings 306 having continuous via bars often have widths substantially less than the thickness of the respective overlying metal lines, and hence do not have enough strength to stop crack propagation during die sawing.

Accordingly, a crack stop structure may be introduced to provide additional support and protection. This structure may be formed by first creating a trench in the substrate. The trench may be creating using dry-etching, such as reactive-ion etching, or other suitable technique in an area of the scribe line, followed by filling the trench with a polymer dielectric material. FIG. 3B shows a side view of the die of FIG. 3A after etching along scribe lines in the substrate 302 under an illustrative embodiment. Here, it can be seen that one or more trenches 310 are formed in the substrate 302 that may extend along an area inside a scribe line (e.g., 330, 332). The structure of the formed trenches 310 may be configured according to an etch rate (e.g., how fast substrate material is removed in the etch process), selectivity (e.g. a ratio of etch rates between the different materials), anisotrophy and uniformity. In some illustrative embodiments, the profile of each trench 310 is substantially rectangular, with substantially vertical walls, and minimal bowing, barreling, or tapering (e.g., ±3'). In other illustrative embodiments, the trench profile may be shaped (e.g., tapered walls) to accommodate different substrate materials and/or configuration. The trench depth is preferably deeper than the depth of the seal rings 306 (e.g., 5-7 microns deeper).

FIG. 3C shows a side view of the die of FIG. 3B and further including a dielectric layer coating of a surface of the die substrate 302, which fills in the space provided by the trenches 310 after etching. In certain illustrative embodiments, the dielectric layer coating is a polymer dielectric layer coating, such as PBO or PI, although other suitable materials may also be used. In an implementation, the polymer dielectric layer coating may be formed by spin coating a layer of PBO or PI onto the surface of wafer substrate 302.

As can be seen from the figure, the polymer dielectric coating 312 may be used to fill the trenches 310 and to create a dielectric layer covering the surface of the substrate 302. Such a configuration may be advantageous for WLP configurations, where additional components are provided within the dielectric layer 312. In other illustrative embodiments, only the trenches 310 are filled with polymer dielectric material, without providing a layer over substrate 302. Such a configuration may be suitable for other chip packaging platforms, such as flip-chip.

FIG. 3D shows a wafer-level side view of additional die components added to the die of FIG. 3C in the dielectric layer coating 312 under an illustrative embodiment. In this example, the die portion of FIG. 3C is expanded in FIG. 3D to show substrate 302 as having substrate portions 302A, 302B prior to cutting, where the cutting areas are designated in the figure by dotted lines. For substrate portion 302A, trenches 310A are etched using any of the techniques described herein. Similarly, trenches 310B are etched for substrate portion 302B. For each of the substrate portions 302A, 302B, polymer dielectric layer coatings 312A, 312B are respectively applied to fill trenches 310A, 310B and to provide a polymer dielectric layer coating 312A, 312B.

Once the polymer dielectric coatings 312A, 312B are applied, additional die components may be applied into the coating, including, but not limited to, pads, passivation layers, insulation and metal layers and UBM layers, collectively illustrated as structure 318 in FIG. 3D for the purposes of brevity. Solder ball 316 may also be provided on structure 318. Once the desired dies components are applied, substrate 302 may be cut according the dotted lines shown in the figure.

Figure 3E:
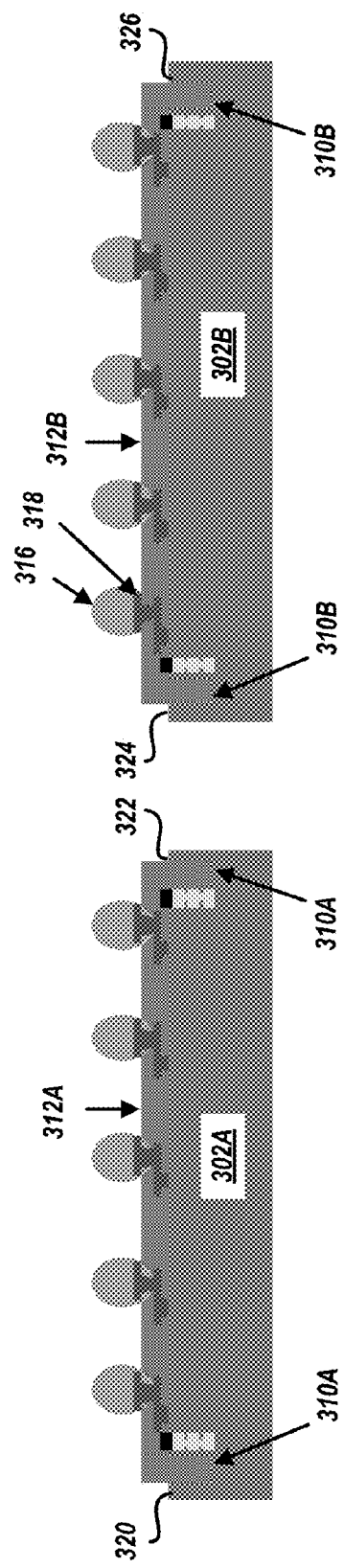
FIG. 3E illustrates a wafer-level side view of the die of FIG. 3D after cutting of the wafer under an embodiment.

FIG. 3E shows a wafer-level side view of the die of FIG. 3D after cutting of the wafer substrate under an illustrative embodiment, resulting in separated, individual dies configured on substrate portions 302A, 302B. As a result of the trenches 310A, 310B being formed and filled with polymer dielectric material 312A, 312B, this creates a crack stop structure that prevents or reduces cracking and/or chipping on substrate edges (320-326). By further providing polymer dielectric material to form a polymer dielectric layer on the surfaces of the substrates (302A, 302B), this layer may provide further support to the polymer dielectric material filling the trenches 310A, 310B.

Figure 4:
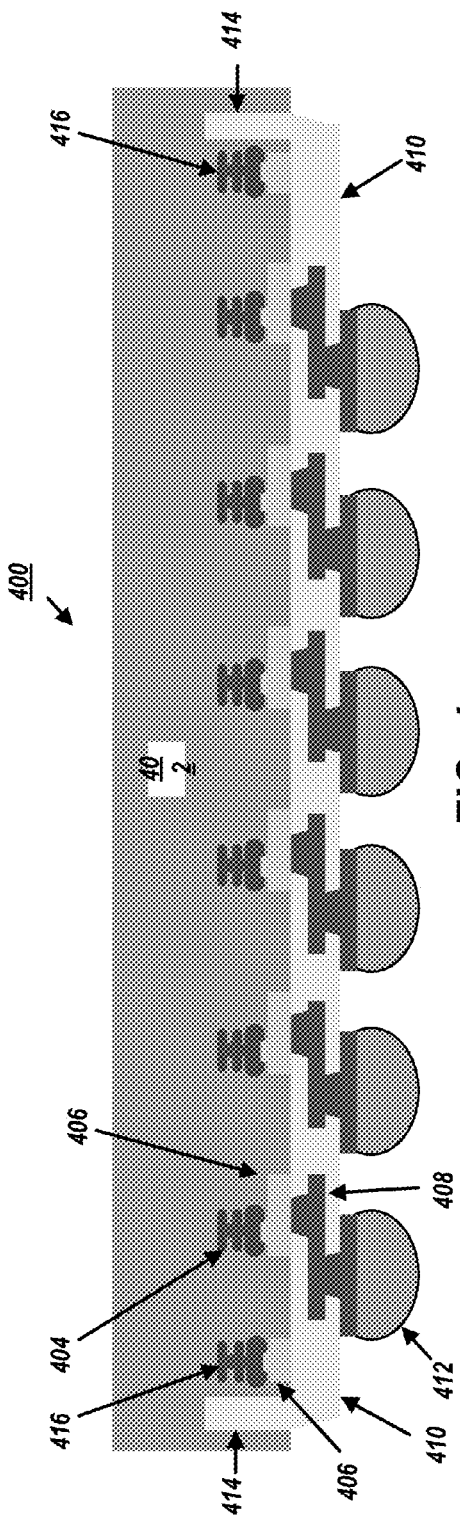
FIG. 4 shows a wafer-level side view of a die having a crack stop configuration including a trench and polymer dielectric layer coating under an illustrative embodiment.

FIG. 4 shows another wafer-level side view of a die having a crack stop configuration including trenches and polymer dielectric layer coating under an illustrative embodiment. Specifically, the example of FIG. 4 shows a single die 400 having a substrate 402 that includes BEOL components such as seal rings 416 that may be formed of interconnected metal lines and connecting vias as shown in the figure. Seal rings may include interconnected metal components, which are formed of metal lines and conductive vias, both formed in dielectric layers. The metal lines and vias may be physically connected and a passivation film may be formed over a top layer of the seal rings 416. BEOL components may further include test structures 404 that may be configured similarly as test structures 304 discussed above in connection with FIG. 3A. Each of the seal rings 416 and test structures 404 may be respectively coupled to a metal contact (e.g., aluminum) 406, as needed.

Trenches 414 may be formed in substrate 402 via dry-etching as discussed above in connection with FIG. 3B, and then filled with a polymer dielectric material 410 as discussed above in connection with FIG. 3C. Additional die components 408 may be applied to the polymer dielectric material 410, including solder ball 412, similar to those discussed above in connection with FIG. 3D. FIG. 5 shows a top view of a die, such as the die of FIG. 4 under an illustrative embodiment, including the crack stop structure of the present disclosure, where polymer dielectric layer 506, which may contain die components, is provided as shown, surrounded by the polymer seal ring 504 that is within and/or on silicon layer 502.

Exemplary Method for Providing/Manufacturing a Semiconductor Device that Includes at Least One Crack Stopping Structure FIG. 6 shows a method for forming a crack stop structure for a semiconductor device under an illustrative embodiment. In block 602, a substrate (e.g., 302, 402) is provided. In some implementations, the substrate is a wafer. Different implementations may use different materials for the substrate (e.g., silicon substrate, glass substrate). In block 604, die components/circuit elements (e.g., 304-308; 404, 406, 416) may optionally be provided in wafer/substrate.

In block 606, trenches (e.g., 310, 414) are formed in the substrate by etching a surface of the substrate inside an area defined by scribe lines of the substrate (e.g., 330, 332). In block 608, a crack stop structure is formed using a polymer dielectric layer coating (e.g., 312, 410) by filling the trenches (e.g., 310, 414) with a polymer dielectric material and providing a dielectric layer (e.g., 312, 410) over the surface of the substrate (e.g., 302, 402) inside the area for reducing cracking or chipping of the substrate in the area defined by scribe lines after cutting (e.g., 320-326).

In block 610, die components may be applied into the coating, where the die components may include, but are not limited to, pads, passivation layers, insulation, metal layers, UBM layers, and solder balls. In block 612 the wafer may be cut to form singular dies, as discussed above in connection with FIGS. 1, 3D and 3E.

Exemplary Electronic Devices

FIG. 7 illustrates various electronic devices that may be integrated with any of the aforementioned integrated device, semiconductor device, integrated circuit, die, interposer, package or package-on-package (PoP). For example, a mobile phone device 702, a laptop computer device 704, and a fixed location terminal device 706 may include an integrated device 700 as described herein. The integrated device 2100 may be, for example, any of the integrated circuits, dies, integrated devices, integrated device packages, integrated circuit devices, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 3A-3E, and 4-7 may be rearranged and/or combined into a single component, step, feature or function or embodied in several components, steps, or functions. Additional elements, components, steps, and/or functions may also be added without departing from the disclosure. It should also be noted that FIGS. 3A-3E, and 4-7 and its corresponding description in the present disclosure is not limited to dies and/or ICs. In some implementations, FIGS. 3A-3E, and 4-7 and its corresponding description may be used to manufacture, create, provide, and/or produce integrated devices. In some implementations, a device may include a die, an integrated device, a die package, an integrated circuit (IC), an integrated device package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device, comprising:
a substrate, wherein the substrate comprises trenches that are etched into a surface of the substrate inside an area defined by scribe lines of the substrate; and
a crack stop structure comprising:
seal rings formed in the substrate inside the area defined by the scribe lines; and
a polymer dielectric layer coating over the seal rings and over the surface of the substrate inside the area defined by the scribe lines, the polymer dielectric layer coating fills the trenches, wherein the polymer dielectric layer coating is configured to reduce cracking or chipping of the substrate in the area defined by scribe lines after cutting.

2. The semiconductor device of claim 1, wherein the trenches are etched via dry-etching.

3. The semiconductor device of claim 1, wherein the trenches are etched via reactive-ion etching.

4. The semiconductor device of claim 1, wherein the trenches are substantially rectangular in structure.

5. The semiconductor device of claim 1, wherein the polymer dielectric material comprises one of polyimide and polybenzoxazole.

6. The semiconductor device of claim 1, wherein the polymer dielectric layer coating is applied to the surface of the substrate via spin coating.

7. The semiconductor device of claim 1, wherein the semiconductor device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in a automotive vehicle, and further including the device.

8. A method for fabricating a semiconductor device, comprising:
providing a substrate;

forming trenches in the substrate by etching a surface of the substrate inside an area defined by scribe lines of the substrate;

forming seal rings in the substrate inside the area defined by the scribe lines; and forming a crack stop structure using a polymer dielectric layer coating, wherein forming the crack stop structure comprises filling the trenches with the polymer dielectric material coating layer over the seal rings and over the surface of the substrate inside the area defined by the scribe lines for reducing cracking or chipping of the substrate in the area defined by the scribe lines after cutting.

9. The method of claim 8, wherein forming trenches in the substrate by etching the surface of the substrate comprises dry-etching the surface of the substrate.

10. The method of claim 8, wherein forming trenches in the substrate by etching the surface of the substrate comprises reactive-ion etching the surface of the substrate.

11. The method of claim 8, wherein forming the trenches comprises forming the trenches in a substantially rectangular structure.

12. The method of claim 8, wherein the polymer dielectric material comprises one of polyimide and polybenzoxazole.

13. The method of claim 8, wherein forming the crack stop structure using a polymer dielectric layer coating comprises spin coating the polymer dielectric layer coating is applied over the surface of the substrate.

14. The method of claim 8, further comprising incorporating the semiconductor into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

15. A semiconductor device, comprising:
a die substrate, wherein the die substrate comprises a periphery formed by cutting, the die substrate further comprising trenches that are etched into a surface of the substrate inside an area of the periphery prior to the cutting; and
a crack stop structure comprising
seal rings formed in the substrate inside the area of the periphery; and
a polymer dielectric layer coating over the seal rings and over the surface of the die substrate inside the area of the periphery that fills the trenches prior to the cutting, wherein the polymer dielectric layer coating is configured to reduce cracking or chipping of the substrate at an edge inside of the periphery.

16. The semiconductor device of claim 15, wherein the trenches are etched via dry-etching.

17. The semiconductor device of claim 15, wherein the trenches are etched via reactive-ion etching.

18. The semiconductor device of claim 15, wherein the trenches are substantially rectangular in structure.

19. The semiconductor device of claim 15, wherein the polymer dielectric material comprises one of polyimide and polybenzoxazole.

20. The semiconductor device of claim 15, wherein the polymer dielectric layer coating is applied to the surface of the substrate via spin coating.

21. The semiconductor device of claim 15, wherein the semiconductor device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

* * * * *